United States Patent [19]
Ando

[11] Patent Number: 5,969,363
[45] Date of Patent: Oct. 19, 1999

[54] METHOD FOR PROCESSING ELECTRON BEAM SOURCES

[75] Inventor: Hiroshi Ando, Hitachinaka, Japan

[73] Assignee: Hitachi, Ltd., Tokyo, Japan

[21] Appl. No.: 09/056,362

[22] Filed: Apr. 7, 1998

[30] Foreign Application Priority Data

Apr. 11, 1997 [JP] Japan ................................. 9-093405

[51] Int. Cl.⁶ ...................................................... H01J 1/14
[52] U.S. Cl. ........................... 250/424; 313/310; 313/311
[58] Field of Search ............................. 250/424; 313/309, 313/310, 311, 351, 336

[56] References Cited

U.S. PATENT DOCUMENTS 5,341,063  8/1994  Kumar ..................................... 313/309
5,463,271  10/1995  Geis et al. ........................... 313/346 R

FOREIGN PATENT DOCUMENTS 5101770  4/1993  Japan .

*Primary Examiner*—Edward P. Westin
*Assistant Examiner*—Nikita Wells
*Attorney, Agent, or Firm*—Kenyon & Kenyon

[57] ABSTRACT

A method of processing electron emitting devices for electron beam sources, wherein the electrons emitted from the electron beam source have an axial symmetric distribution of emitted electrons include determining a crystal axis direction of the crystal bar used as the material for the electron beam source, and cutting out chip material in such a manner that the longitudinal direction of the axis of the electron emitting device coincides with the crystal axis direction of the crystal bar. As a result, the emitted electrons becomes symmetrical to the axial direction, forming an axially symmetrical distribution, and a uniform electron irradiation on a specimen can be achieved in electron microscopes, electron beam inspection and measuring apparatus, electron lithography systems, and the like.

2 Claims, 7 Drawing Sheets

(a)

(b)

(c)

AN AXIAL DIRECTION OF CHIP (a)

(b)

(c)

AN AXIAL DIRECTION OF CHIP

METHOD FOR PROCESSING ELECTRON BEAM SOURCES

BACKGROUND OF THE INVENTION

The present invention relates to an electron beam source for use in electron microscopes and electron beam inspection and measuring apparatus for evaluating and inspecting semiconductors integrated circuits, electron beam lithography systems for depicting circuit patterns on semiconductors, and the like. Particularly, the present invention relates to a method for processing materials of electron emitting devices for use in electron beam sources.

When a material for use in an electron beam source is manufactured, conventionally, the manufacturing has been mostly performed without regard to the to the crystal direction of the material. A method for obtaining a needle shaped electron emitting material having a curvature of equal to or less than 50 nm by forming a needle like end portion of a crystal rod or a crystal bar utilizing a cleavage plane, and subsequently performing an anisotropic etching has been disclosed in JP-A-5-101770 (1993). However, the prior art discloses a method for obtaining a field emission type cathode which is operable with the lowest voltage than ever before, and the prior art does not teach how to utilize the cleavage plane of the material in manufacturing.

FIGS. 2(a), 2(b), and 2(c) illustrate a conventional manufacturing method for an electron beam source. FIG. 2(a) is a plan view of a crystal bar, i.e., a material for manufacturing, FIG. 2(b) is a plan view and a side view of a chip base material 2 cut out from the crystal bar, and FIG. 2(c) is a plan view and a side view of a chip 3 cut out from the chip base material 2.

In accordance with FIG. 2(a), the crystal bar 1 has an axial direction 4 of its mechanical axis and an axial direction 5 of its crystal axis in the process of manufacturing, and the directions of the mechanical and crystal axes do not coincide each other. The end plane of the crystal bar 1 is tilted with respect to the axial direction 4 of the mechanical axis, and the end plane is a cleavage plane of the crystal. Conventionally, the chip base material 2 was cut out from the crystal bar 1 by cutting perpendicularly to the mechanical axis of the crystal bar 1 with a designated length, and the chip 3 was also cut out from the chip base material 2 in a manner that the longitudinal direction of the chip is the same as the mechanical direction 4 of the crystal bar 1. When the chip cut out in the manner described above is manufactured, the axial direction 4 of the chip 3 does not coincide with the crystal direction 5 of the chip 3.

FIG. 3 is a schematic side view of an electron emitting device 6 manufactured from the above chip 3, which is used by being attached to an electron beam source of the above-mentioned electron microscope, electron beam inspection and measuring apparatus, electron beam lithography system, and the like. The chip 3 is a rectangular solid as shown in FIG. 2(c), and the chip is manufactured into an electron emitting device 6 having a shape shown in FIG. 3. An end of the electron emitting devise 6 is formed as a hemispherical portion 61 for emitting electrons, and another end is a fixing portion for attaching to the electron beam source. The electron emitting device 6 is attached to the electron beam source so that the axial direction (shown by a one dot chain line) of the device coincides with the axial direction of the electron beam of the apparatus, and the electron beam is emitted from the hemispherical portion 61 of the electron beam emitting device 6 by applying a voltage.

In the above apparatus, not only the intensity and energy of the electron beam, but also uniformity of electron irradiation in a plane of the material, to which the electron beam is irradiated, must be controlled. When the electron emitting device 6 manufactured by the conventional method shown in FIG. 2 is used, the emitted electrons are not axially symmetrical to the axial direction 4, because the axial direction of the electron emitting device 6 does not coincide with the crystal direction 5. This results in a problem because the emitted electron distribution is not axially symmetrical.

FIG. 10 indicates a spread of an electron beam seen from the electron beam source when an electron beam is irradiated onto a specimen. For instance, in an electron beam lithography system, the size of the spread of the irradiated electron beam must be changed depending on the pattern to be depicted. The region A in FIG. 10 indicates the ordinary size of an irradiation field of the electron beam, and the region B indicates an extended field of the electron beam. When an electron emitting device 6 processed by the above conventional manufacturing method is used, the region B becomes not a circle but an ellipse, because the axial direction of the electron emitting device 6 does not coincide with the crystal direction 5. Accordingly, an effective region of beam for writing becomes a rectangle inscribed in the ellipse, which is smaller than a rectangle inscribed in a circle, as described in more detail below.

SUMMARY OF THE INVENTION

The object of the present invention is to provide a method for processing an electron emitting device for electron beam sources, which emits the electrons having an axial symmetrical distribution.

The above object can be achieved by determining the crystal axis Direction of the crystal bar used as the material for the electron beam source, and cutting out a chip of material in a manner that the longitudinal direction of the axis of the electron emitting device coincides with the crystal axis direction of the crystal bar. As a result, the emitted electrons become symmetrical to the axial direction 4. Thus, the emitted electrons form an axially symmetrical distribution, and a uniform electron irradiation onto a specimen can be achieved by mounting the electron emitting device to the electron beam source in a manner such that the axial direction of the electron emitting device coincides with the axis of the electron beam of the electron microscope, electron beam inspection and measuring apparatus, electron lithography system, and the like, and generating the electron beam by supplying a voltage to the electron beam source.

BRIEF DESCRIPTION OF THE DRAWINGS

These and other objects, features and advantages of the present invention will be understood more clearly from the following detailed description with reference to the accompanying drawings, wherein, FIG. 1(a) is a plan view of the crystal bar 1, i.e. a manufacturing material, FIG. 1(b) indicates a plan view and a side view of a chip base material 2 cut out from the crystal bar 1, and FIG. 1(c) indicates a side view of a chip 3 cut out from the chip base material 2.

FIG. 2(a) is a plan view of the crystal bar 1, i.e., a manufacturing material, FIG. 1(b) indicates a plan view and a side view of a chip base material 2 cut out from the crystal bar 1, and FIG. 1(c) indicates a plan view and a side view of a chip 3 cut out from the chip base material 2.

DETAILED DESCRIPTION

In electron microscopes and electron beam inspection and measuring apparatus for evaluating and inspecting semiconductor integrated circuits and the like, electron beam lithography systems for writing circuit patterns onto semiconductors, and the like, an electron beam is generated and irradiated onto a specimen for drawing the circuit patterns, detecting electrons reflected from the specimen, and detecting secondary electrons generated from the irradiated specimen, and size measurements, evaluations, inspections, and the like are performed.

Figure 3:
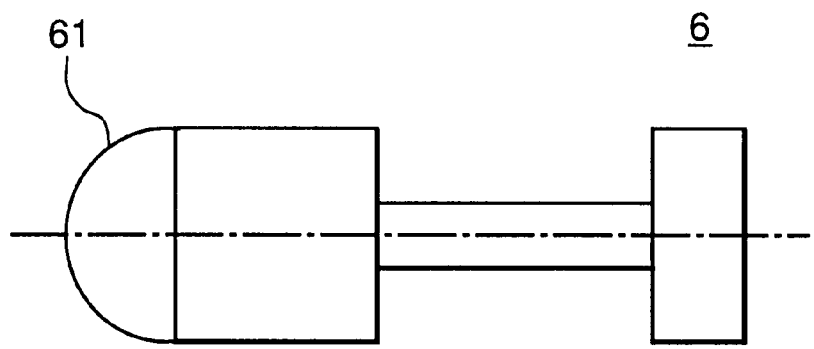
FIG. 3 is a side view of an electron emitting device 6, which is obtained by processing the chip 3, to be attached to an electron beam source.
Figure 11:
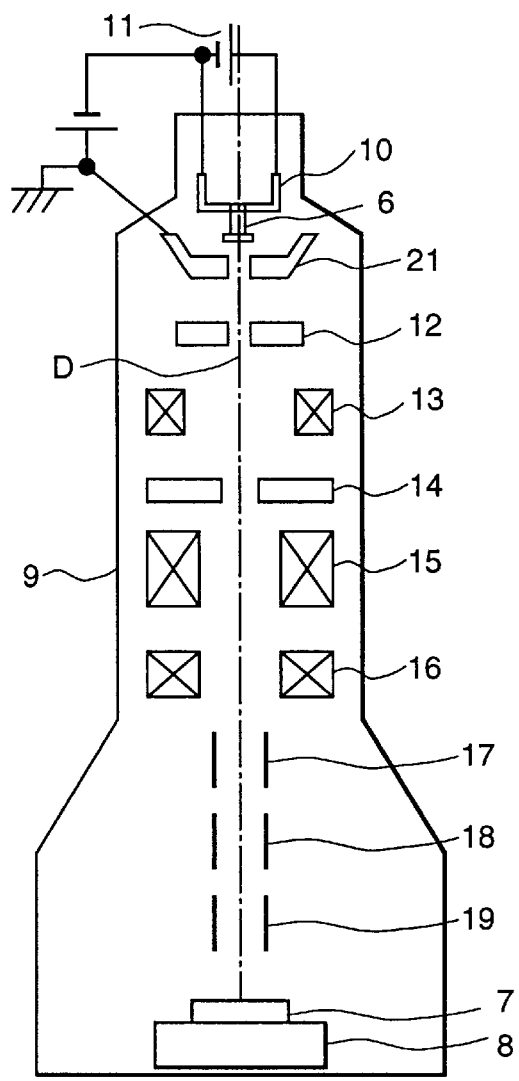
FIG. 11 is a schematic vertical cross sectional view of an apparatus using the electron beam.

FIG. 11 is a schematic vertical cross sectional view of an apparatus using an electron beam. The specimen to be irradiated with the electron beam is placed on a stage 8, and covered with a column 9. The inside of the column is maintained in a reduced pressure environment. The electron emitting device 6 is fixed to the electron beam source 10, and heated by supplying a voltage from a power source 11. Electrons are emitted from the heated electron emitting device 6. FIG. 3 indicates a side view of the electron emitting device 6, showing that electrons are emitted from the hemispherical portion 61. A path of the electron beam to the specimen 7 is indicated by a one dot chain line designated as D in FIG. 11. The electron beam is withdrawn from the electron beam emitting device 6 by a withdraw electrode 21, and the electron beam is throttled in its diameter by an aperture 12, focused by focus coils 13, 15, 16 and a second aperture 14, deflected by static deflecting coils 17, 18, 19, and irradiated onto the specimen 7.

Controlling the intensity, energy, and other characteristics of the electron beam generated by the electron emitting device 6 is important for the above apparatus. Furthermore, the electron beam is required to have a shape of axial symmetry to direction along a central axis, in which direction the electron beam is to be emitted.

For instance, when used in an electron lithography system, the generated electron beam is focused finely by magnetic field lenses, and irradiated onto the specimen which is exposed to the electron beam. In this case, the plane of the specimen irradiated with the electron beam is required to have a uniform electron density in view of a relationship between uniformity and the accuracy of the lithography. Therefore, the electron beam must be emitted in a designated direction with axial symmetry along an axis extending in that direction.

However, when the electron beam source is manufactured with a crystal material, the axial direction of the electron emitting device 6 which emits the electron beam does not necessarily coincide with the direction along which the electron beam is emitted. This is, because the electron emissivity of the electron emitting device 6 differs depending on the direction of the crystal axis of the material. Accordingly, it is necessary to make the axial direction of the electron emitting device 6 coincide with the direction of the crystal axis of the material.

Figure 1:
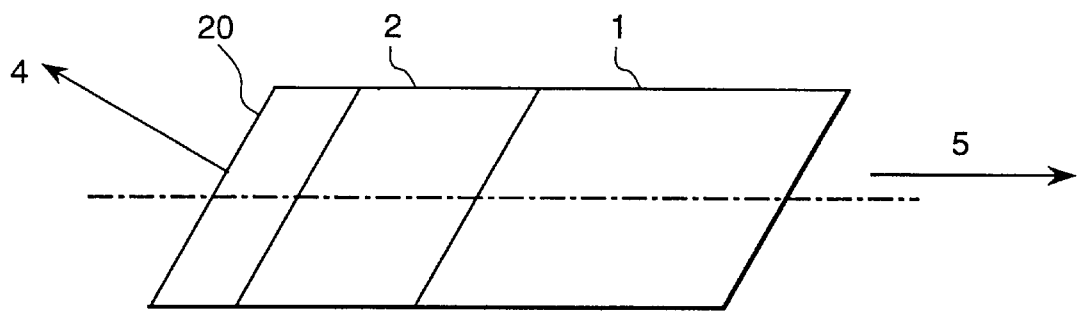
FIG. 1 illustrates a method for processing a chip from a crystal bar relating to the present invention.
Figure 1:
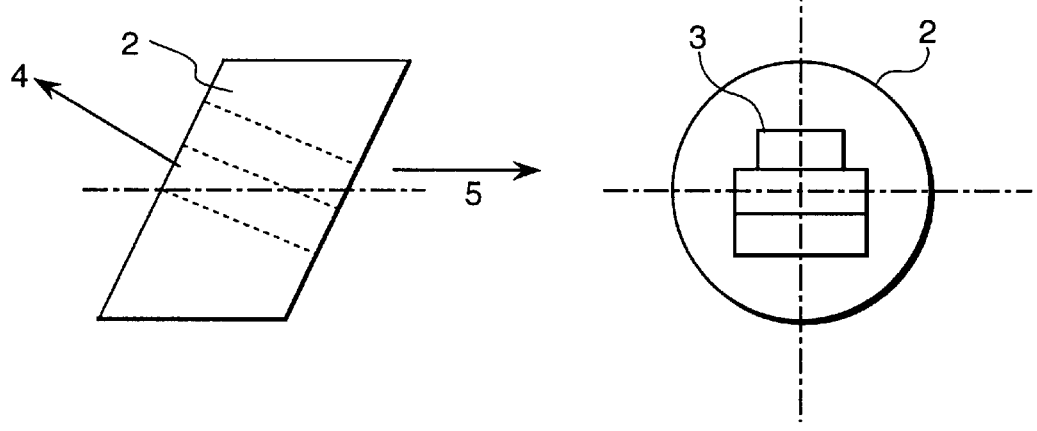
Figure 1:
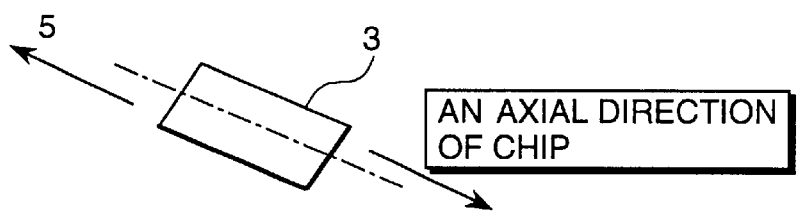
Figure 2:
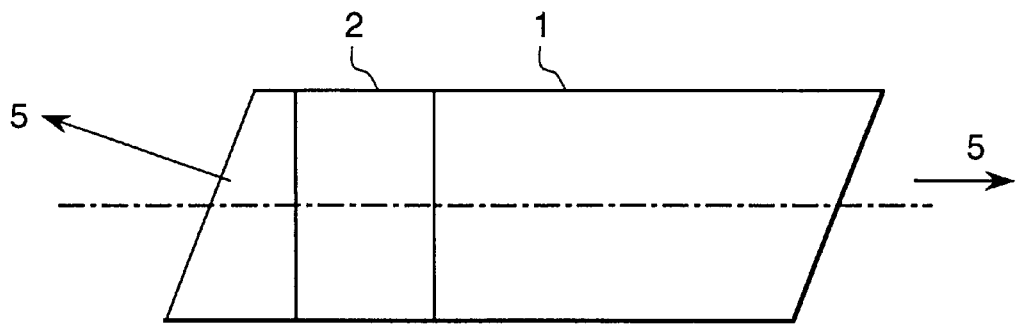
FIG. 2 illustrates a conventional processing method.
Figure 2:
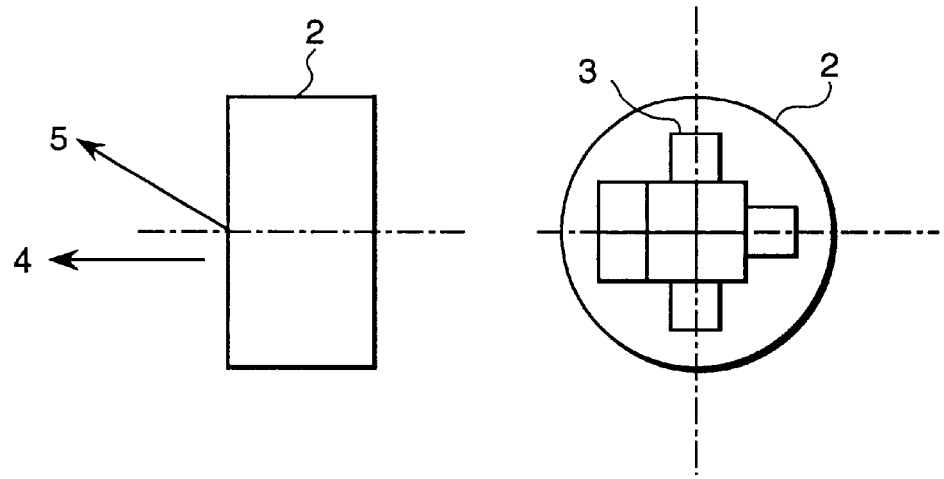
Figure 2:
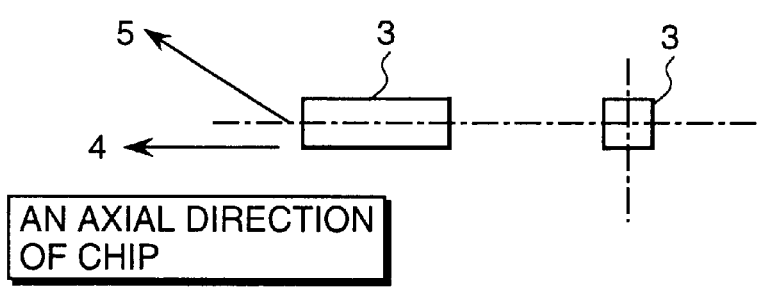

FIG. 1 indicates a method for processing a chip from a crystal bar relating to the present invention. FIG. 1(*a*) is a plan view of the crystal bar 1, i.e., a manufacturing material. FIG. 1(*b*) is a plan view and a side view of a chip base material 2 cut out from the crystal bar 1. FIG. 1(*c*) is a side view of a chip 3 cut out from the chip base material 2.

In FIG. 1(*a*), the end plane of the crystal bar 1 is a cleavage plane 20 of the crystal. At the cleavage plane, atoms of the crystal bar are aligned, and the material is homogeneous; and when the cleavage plane is used as the electron emitting plane, the electrons are emitted uniformly. Because the cleavage plane crosses perpendicularly with the crystal axis, the electrons are emitted uniformly by making the direction of the crystal axis coincide with the axial direction 5 of the electron emitting device 6.

The cleavage plane 20 extends when a bending force is applied to the crystal bar 1, and the crystal bar 1 is cut parallel to the cleavage plane. The cutting plane becomes the cleavage plane 20.

Manufacturing steps of the crystal bar 1 are explained hereinafter.

First, the chip base material 2 is cut out in parallel to the cleavage plane 20 of the crystal bar 1 as indicated in FIG. 1(*a*). For instance, the cutting plane of a cutter and the cleavage plane 20 are set in parallel each other by contacting a plane of the circular cutter of the manufacturing apparatus with the cleavage plane 20 in parallel each other. Consequently, the cutting plane of the chip base material 2 cut by the cutter becomes parallel with the cleavage plane 20. Then, the chip 3 is cut out perpendicular to the cleavage plane 20 as indicated in FIG. 1(*b*). The axial direction of the chip 3 coincides with the axial direction of the crystal, because the cleavage plane 20 is perpendicular to the crystal axial direction. Subsequently, the electron emitting device 6 is manufactured so that the axial direction of the chip 3 coincides with the axial direction of the electron emitting device 6 as indicated in FIG. 1(*c*).

Figure 4:
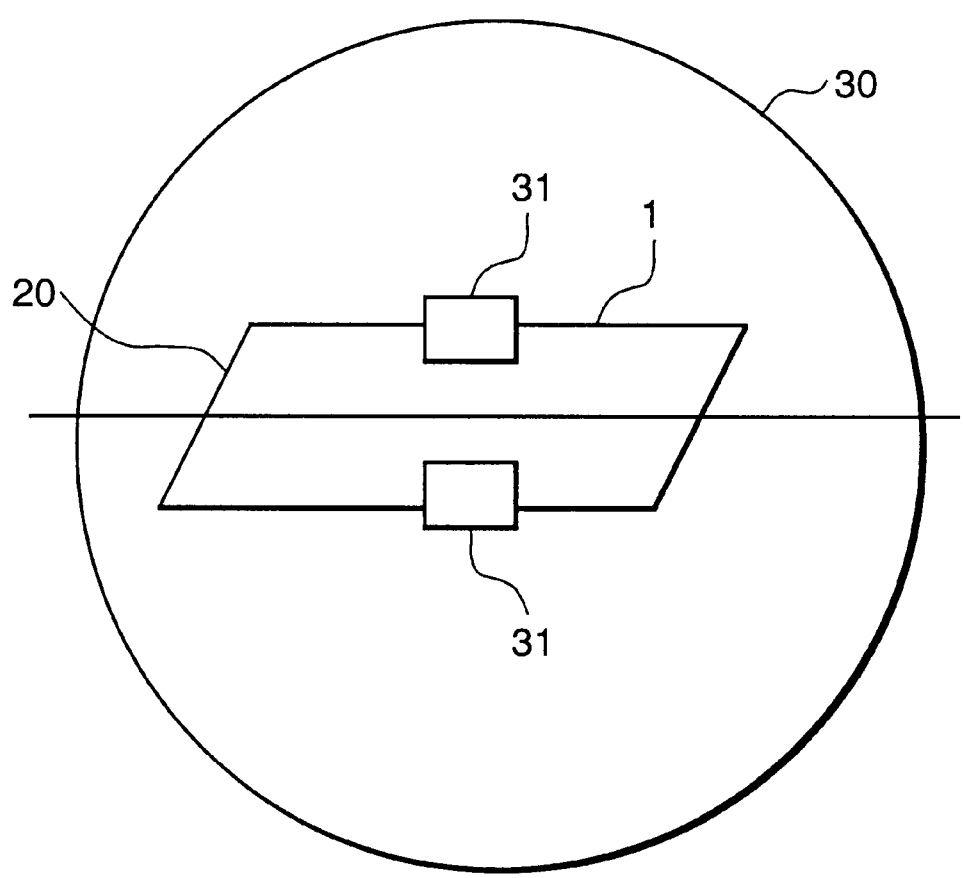
FIG. 4 is a plan view indicating a crystal bar 1 mounted on a holder 30 of a manufacturing apparatus.
Figure 5:
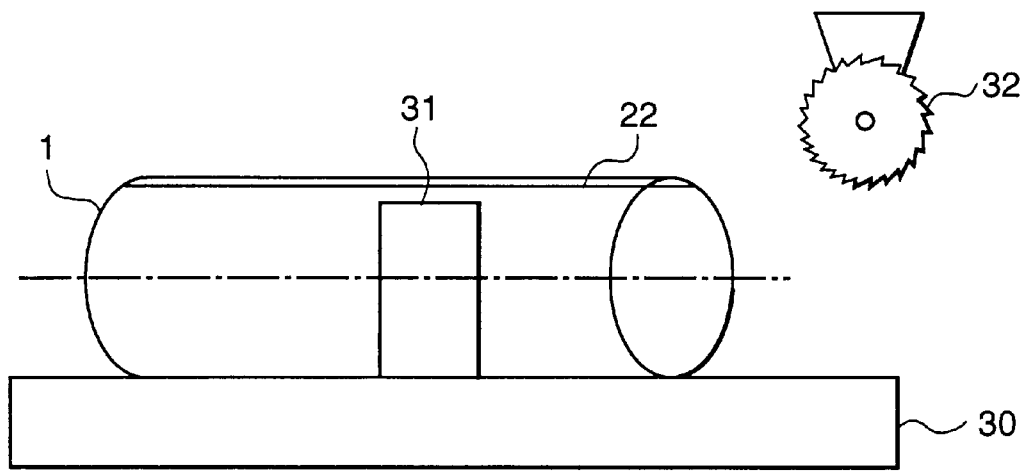
FIG. 5 is a schematic perspective side view of the crystal bar 1 shown in FIG. 4.
Figure 6:
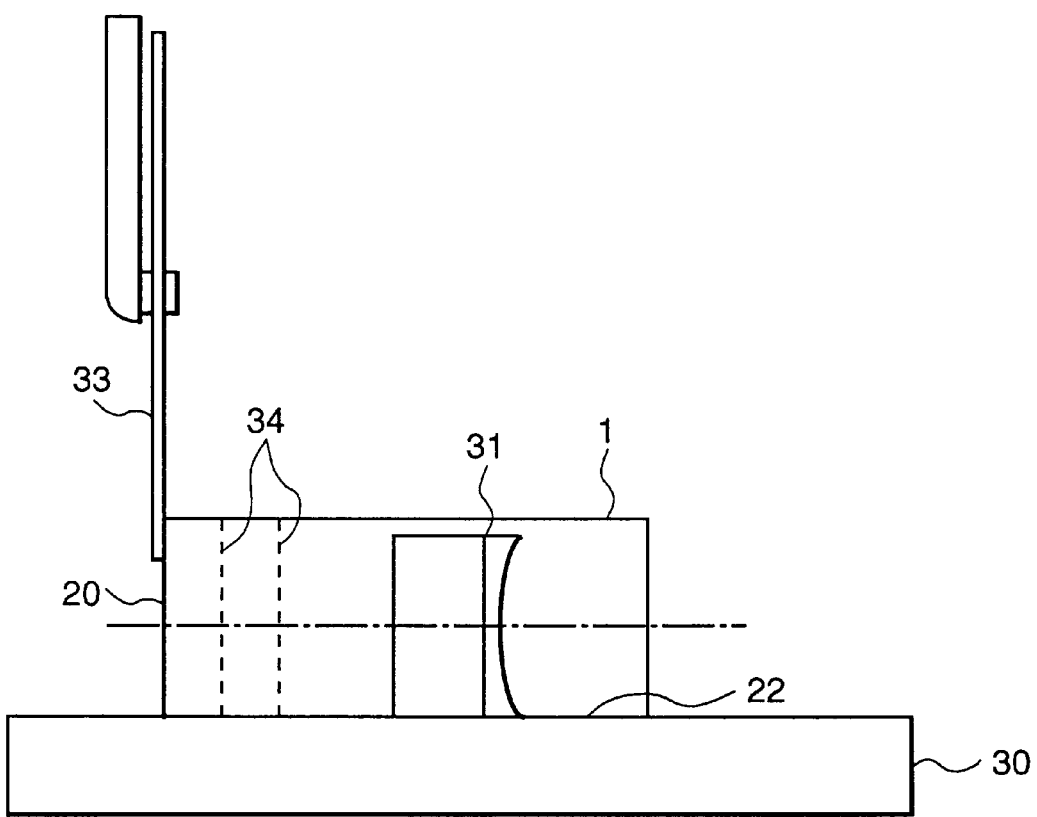
FIG. 6 is a side view of the crystal bar 1 shown in FIG. 4.
Figure 7:
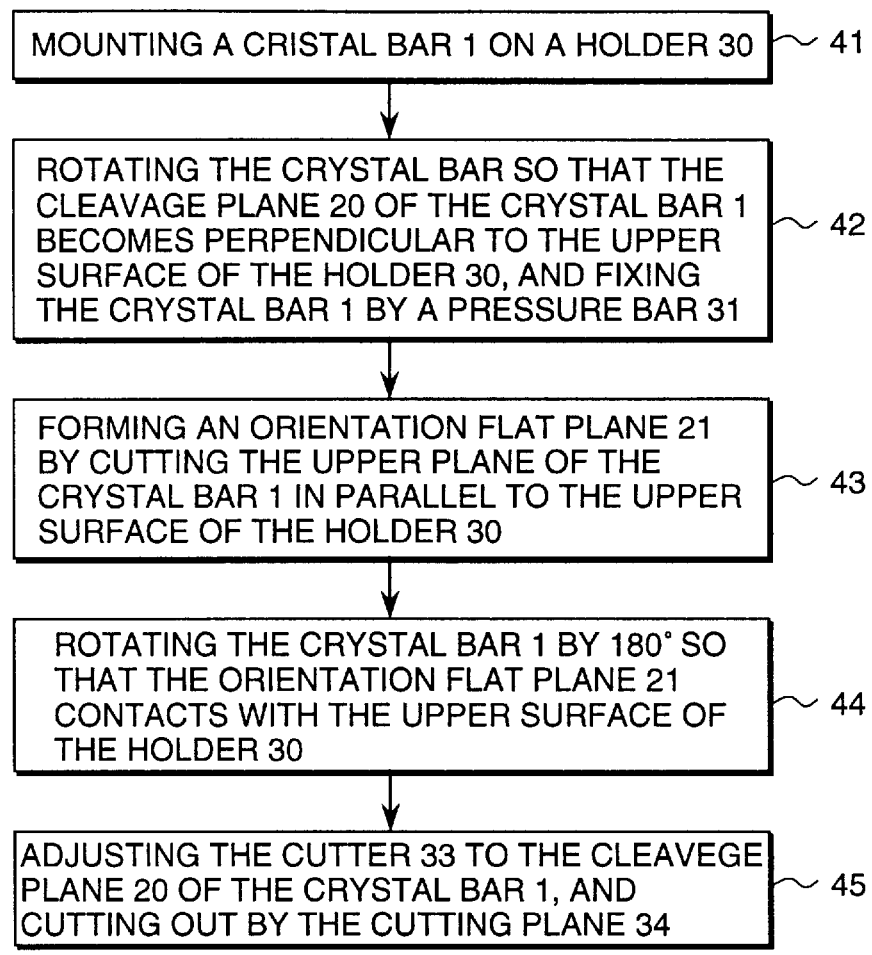
FIG. 7 is a flow chart indicating manufacturing steps shown in FIG. 4 to FIG. 6.
Figure 8:
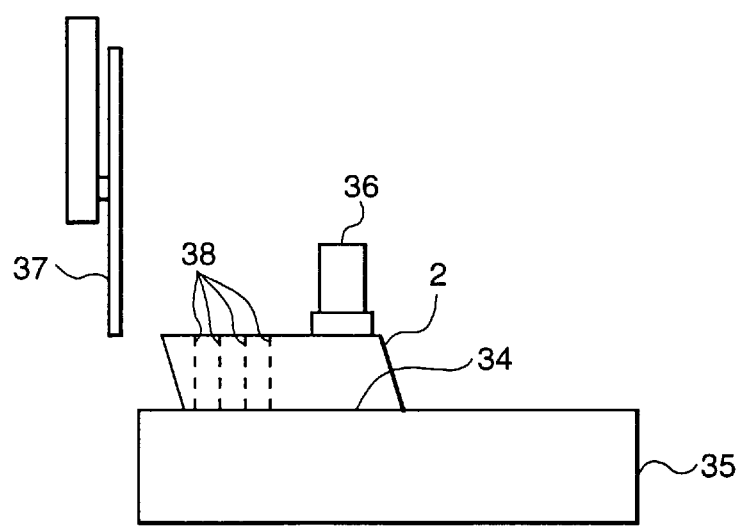
FIG. 8 is a side view of another manufacturing apparatus.
Figure 9:
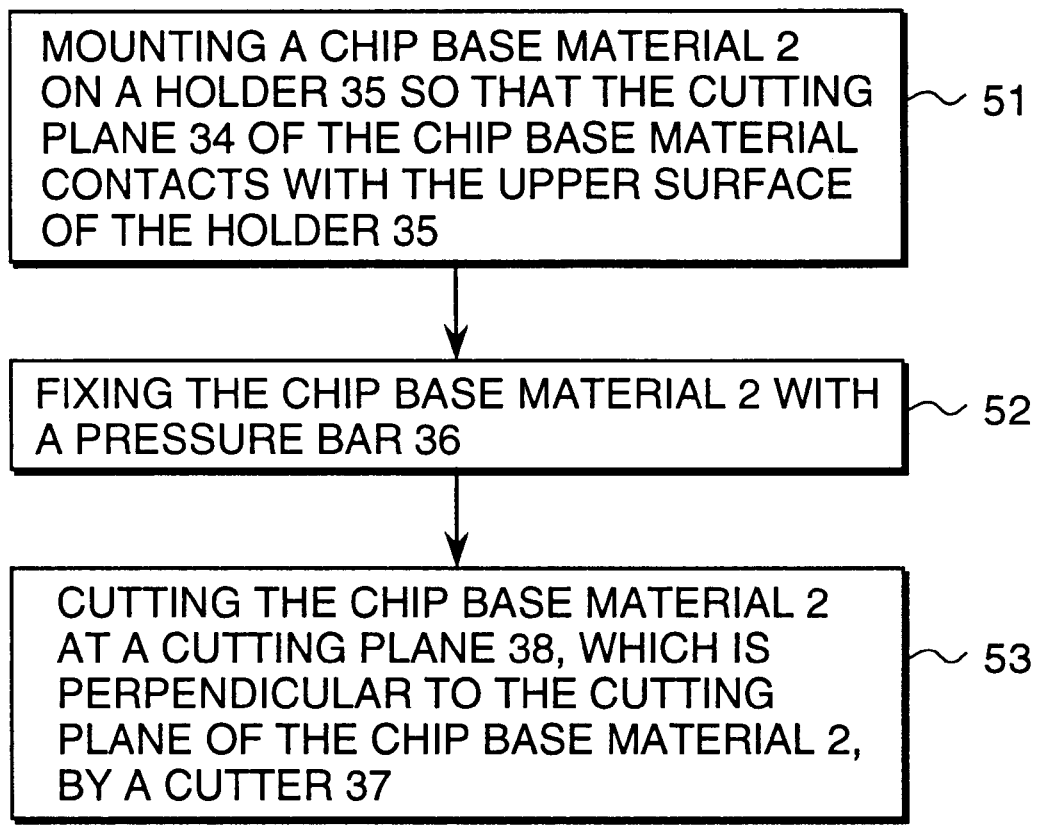
FIG. 9 is a flow chart indicating manufacturing steps shown in FIG. 8.

More practically, the manufacturing steps, explained referring to FIG. 1, are set out in FIG. 4 to FIG. 9. FIG. 4 is a plan view showing a crystal bar 1 mounted on a holder 30 of a manufacturing apparatus. FIG. 5 is a schematic perspective side view of the crystal bar 1 shown in FIG. 4. FIG. 6 is a side view of the crystal bar 1 shown in FIG. 4. FIG. 7 is a flow chart indicating the manufacturing steps shown in FIG. 4 to FIG. 6. FIG. 8 is a side view of another manufacturing apparatus, and FIG. 9 is a flow chart indicating manufacturing steps of the apparatus shown in FIG. 8.

In FIG. 4, the crystal bar 1 is mounted on the holder 30 of the manufacturing apparatus corresponding to step 41 of the flow chart shown in FIG. 7. The crystal bar is rotated so that the cleavage plane 20 of the crystal bar 1 becomes perpendicular to the upper surface of the holder 30, and fixed with a pressure bar 31 in step 42. In FIG. 5, the upper surface of the crystal bar 1 is cut by the cutter 32 parallel to the upper surface of the holder 30 as indicated by step 43 of the flow chart shown in FIG. 7 to form an orientation flat 22. In FIG. 6, the orientation flat 22 is brought into contact with the upper surface of the holder 30 by rotating the crystal bar by 180 degrees in order to prevent rotating further, and fixed by a pressure bar 31 in step 44 of the flow chart shown in FIG. 7. Then, the chip base material 2 is prepared by cutting the crystal bar 1 at the cutting plane 34 by adjusting the cutter 33 to the cleavage plane 20 of the crystal bar 1 in step 45 of the flow chart shown in FIG. 7. At that time, the cutting plane 34 becomes in parallel with the cleavage plane 20. The cleavage plane 20 is readily adjusted to the direction of the cutter 33, because the holder 30 rotates in a vertical direction to the cutter 33.

Next, the chip base material is mounted on the other manufacturing apparatus shown in FIG. 8 so that the cutting plane 34 of the chip base material 2 is in contact with the upper surface of the holder 35 indicated by step 51 of the flow chart shown in FIG. 9. The chip base material 2 is fixed by a pressure bar 36 in step 52 shown in FIG. 9, and a chips 3 are manufactured by cutting the chip base material 2 at the cutting planes 38, which are perpendicular to the cutting plane 34 of the chip base material 2, with the cutter.

Then, the electron emitting device 6 is attached to the electron beam source of the electron beam apparatus indicated in FIG. 11 so that the axial direction of the electron emitting device 6 coincides with the axial direction (orbit D), in which the electron beam of the apparatus must be emitted, and the electron beam is generated by supplying a voltage to the electron beam source. In this case, the emitted electrons have an axially symmetric emitting distribution, because the axial direction of the electron emitting device 6 coincides with the axial direction of the crystal.

Figure 10:
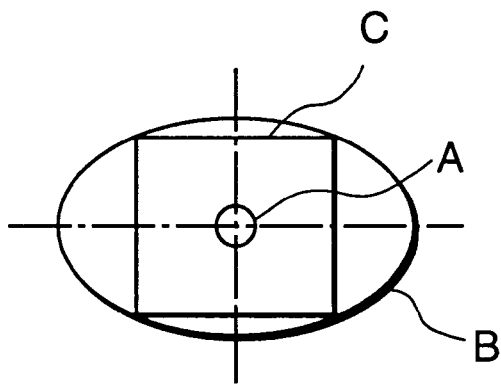
FIG. 10 is a plan view indicating a spread of electron beam seen from the electron beam source when the electron beam is irradiated onto a specimen.
Figure 12:
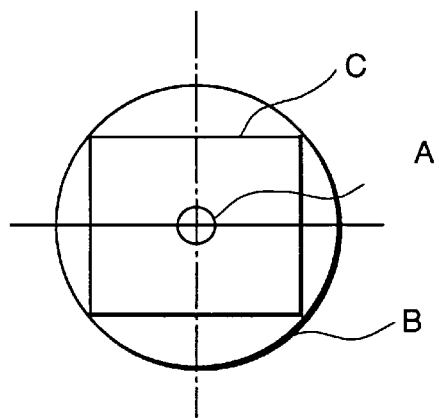
FIG. 12 is a plan view indicating a spread of electron beam seen from the electron beam source when the electron beam is irradiated onto a specimen.

FIG. 12 indicates a spread of an electron beam seen from the electron beam source when the electron beam is irradiated on a specimen. For instance, as previously explained relating to FIG. 10, the electron beam lithography system sometimes changes the spread size of the irradiating electron beam depending on the pattern to be depicted. The region A in FIG. 12 indicates the ordinary size of an irradiation field of the electron beam, and the region B indicates an extended field of the electron beam. When the electron emitting device 6 processed by the manufacturing method relating to the present invention is used, the region B does not become an ellipse as shown in FIG. 10, but a circle, because the axial direction of the electron emitting device 6 coincides wits the crystal direction 5. Accordingly, the effective region of the beam for writing becomes a rectangle inscribed in the circle, which is larger than rectangle inscribed in an ellipse as shown in FIG. 10. Therefore, the writing range of the electron beam can be increased, and an efficiency of writing can be improved.

As explained above, in accordance with the present invention, the emitted electrons are distributed in an axially symmetrical distribution, because the axial direction of the electron emitting device 6, which is determined in the mechanically manufacturing of the electron emitting device, coincides with the axial direction of the crystal, and a uniform electron irradiation of the specimen becomes possible by attaching the electron emitting device 6 to the electron beam source of the electron beam apparatus and generating the electron beam by supplying a voltage to the electron beam source.

What is claimed is:

1. A method for processing crystal material to form electron emitting sources for electron beam apparatus comprising:

processing said crystal material so that the axial direction of said crystal material coincides with the direction of an electron beam to be emitted from said crystal material when it is formed into an electron emitting source.

2. A method for processing crystal material to form electron emitting sources for electron beam apparatus comprising:

cutting said crystal material so that the cutting plane of the crystal material is parallel to a cleavage plane of the crystal material, and processing said cut crystal material by further cutting said crystal material so that the longitudinal direction of said crystal when formed into an electron emitting source coincides with a direction perpendicular to the cutting plane of said crystal material.

* * * * *